US012665492B2

(12) United States Patent
Jeong et al.

(10) Patent No.: US 12,665,492 B2
(45) Date of Patent: Jun. 23, 2026

(54) APPARATUS AND METHOD FOR DIAGNOSING A FAILURE OF AN INVERTER

(71) Applicants: HYUNDAI MOTOR COMPANY, Seoul (KR); KIA CORPORATION, Seoul (KR); AJOU UNIVERSITY INDUSTRY-ACADEMIC COOPERATION FOUNDATION, Suwon-si (KR)

(72) Inventors: Gi Heon Jeong, Hwaseong-si (KR); Sae Hyun Park, Daegu (KR); Chan Mook Choi, Incheon (KR); Kyo Beum Lee, Seoul (KR); Hyung Woo Lee, Suwon-si (KR)

(73) Assignees: HYUNDAI MOTOR COMPANY, Seoul (KR); KIA CORPORATION, Seoul (KR); AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 333 days.

(21) Appl. No.: 18/533,097

(22) Filed: Dec. 7, 2023

(65) Prior Publication Data

US 2024/0405664 A1 Dec. 5, 2024

(30) Foreign Application Priority Data

Jun. 2, 2023 (KR) ........................ 10-2023-0071235

(51) Int. Cl.
*H02M 1/32* (2007.01)
*G01R 31/327* (2006.01)
(Continued)

(52) U.S. Cl.
CPC .......... *H02M 1/32* (2013.01); *G01R 31/3275* (2013.01); *H02M 7/5395* (2013.01)

(58) Field of Classification Search
CPC ......... H02M 1/32–325; H02M 7/5387–53871; H02M 7/5395; G01R 31/327–3275; G01R 31/52
See application file for complete search history.

(56) References Cited

U.S. PATENT DOCUMENTS

2013/0187678 A1* 7/2013 Erdos ..................... G01R 31/34
324/764.01
2014/0054103 A1* 2/2014 Kezobo ................ G01R 31/343
180/446
(Continued)

FOREIGN PATENT DOCUMENTS

KR 20110062945 A 6/2011
KR 101822546 B1 1/2018
(Continued)

OTHER PUBLICATIONS

Yahyaoui, R Published 2016 "Switch Short-Circuit Fault Detection Algorithm based on Drain-to-Source Voltage Monitoring for a Fault Tolerant DC/DC Converter." (Year: 2016).*
(Continued)

*Primary Examiner* — Sisay G Tiku
(74) *Attorney, Agent, or Firm* — Lempia Summerfield Katz LLC

(57) ABSTRACT

An apparatus for diagnosing failure of an inverter includes switches coupled to three phases of A, B, and C, respectively. The apparatus also includes a measurer configured to measure each of the output currents of the three phases. The apparatus also includes a comparison processor configured to receive the output currents measured by the measurer and compare the received output currents with a set value. The apparatus also includes a failure determination processor configured to detect a switch having an output current equal to or smaller than the set value based on the comparison performed by the comparison processor to determine the
(Continued)

switch as faulty. The failure determination processor is also configured to, upon detecting faulty switch, identify which phase switch is faulty to change the duty ratio of the switch determined to be faulty and to perform phase shift on switches not determined to be faulty.

18 Claims, 4 Drawing Sheets

(51) Int. Cl.
  H02M 7/538 (2007.01)
  H02M 7/5395 (2006.01)

(56) References Cited

U.S. PATENT DOCUMENTS

2014/0300305 A1* 10/2014 Itamoto .............. H02P 29/0243
                                                            318/474
2022/0115958 A1*  4/2022 Rastogi ................... H02M 1/32

FOREIGN PATENT DOCUMENTS

KR        101823140 B1     3/2018
KR        101893174 B1     8/2018
KR        101965239 B1     4/2019

OTHER PUBLICATIONS

Ok-Sun Yu et al., A Novel Fault Detection Scheme for Voltage Fed PWM Inverter; The Transactions of the Korean Institute of Power Electronics, Feb. 2007; 8 pp.

S.H Lee et al., Design of PI Controller for Heated-Glass Temperature Control System; Power Electronics Conference, Nov. 2011; 3 pp.

Su Hyeong Lee, Power Line Communication-based Heated Glass Temperature Control System; Master's Thesis, Pukyong National University; Feb. 2012; 59 pp.

* cited by examiner

| Category | SQ0 | SQ1 | SQ2 | SQ3 | Failure |
|---|---|---|---|---|---|
| Phase A current | IH | −IH | IH | −IH | None |
| Phase C current | IH | −IH | IH | −IH | |
| Phase A current | O | −IH | O | −IH | Phase A upper end |
| Phase C current | IH | −IH | IH | −IH | |
| Phase A current | IH | O | IH | O | Phase A lower end |
| Phase C current | IH | −IH | IH | −IH | |
| Phase A current | IH | −IH | IH | −IH | Phase C upper end |
| Phase C current | O | −IH | O | −IH | |
| Phase A current | IH | −IH | IH | −IH | Phase C lower end |
| Phase C current | IH | O | IH | O | |
| Phase A current | IH | O | IH | O | Phase B upper end |
| Phase C current | IH | O | IH | O | |
| Phase A current | O | −IH | O | −IH | Phase B lower end |
| Phase C current | O | −IH | O | −IH | |

FIG. 3

APPARATUS AND METHOD FOR DIAGNOSING A FAILURE OF AN INVERTER

CROSS-REFERENCE TO RELATED APPLICATION

This application claims, under 35 U.S.C. § 119(a), the benefit of and priority to Korean Patent Application No. 10-2023-0071235, filed on Jun. 2, 2023, the entire contents of which are incorporated herein by reference.

BACKGROUND

(a) Technical Field

The present disclosure relates to an apparatus and a method for diagnosing failure of an inverter. More particularly, the present disclosure relates to an apparatus and a method for diagnosing failure of an inverter configured to, when any of inverters located at the upper and lower ends of each phase fails, perform phase shift on inverters in normal operation to implement fail-safe function.

(b) Background Art

Today, a three-phase pulse width modulated (PWM) inverter is widely used in various industrial fields, such as a variable speed motor control, an uninterruptible power supply, and an active power filter. A power semiconductor switch, i.e., a key component of the PWM inverter, may often fail due to unexpected overheating or mechanical or electrical stress. Therefore, a method of diagnosing failure of an inverter switch to ensure reliability and safety of the system needs to be devised.

A switch failure may be largely classified into a short-circuit failure and an open-circuit failure. The short-circuit failure causes serious damage to the system due to instantaneous flowing of a large current, so it is common to use a gate driver or additional hardware to protect the system.

The open-circuit failure is a failure that a switch is continuously opened. Unlike the short-circuit failure, open-circuit failure does not cause immediate damage to the entire system. However, when the system operates continuously without the open-circuit failure being detected, the accumulated stress causes secondary failure of the system, resulting in system shutdown and repair costs involved therewith.

Therefore, there is a need for an apparatus and a method capable of detecting and identifying the switch short-circuit failure or the switch open-circuit failure. Moreover, there is a need to secure redundancy to overcome such failure.

The above information disclosed in this Background section is only to enhance understanding of the background of the disclosure. Therefore, the Background section may contain information that does not form the prior art that is already known in this country to a person of ordinary skill in the art.

SUMMARY

The present disclosure has been made in an effort to solve the above-described problems associated with the prior art. An object of the present disclosure is to provide an apparatus configured to determine whether any of power semiconductor switches located at the upper and lower ends of each phase of an inverter is faulty.

Another object of the present disclosure is to provide an inverter fault detection and tolerant control apparatus configured to, when any of the power semiconductor switches located at the upper and lower ends of each phase of the inverter is determined to be faulty, perform phase shift on phases in normal operation so as to make the output effective value of the faulty switch equal to the effective value in a normal state.

The objects of the present disclosure are not limited to the foregoing objects. Other objects of the present disclosure not mentioned herein may be understood based on the following description and may be understood more clearly through the embodiments of the present disclosure. In addition, the objects of the present disclosure may be realized by means and combinations thereof indicated in the claims.

In one aspect, the present disclosure provides an apparatus for diagnosing failure of an inverter. The apparatus includes switches coupled to three phases of A, B, and C, respectively. The apparatus also includes a measurer configured to measure each of output currents of the three phases. The apparatus also includes a comparison processor configured to receive the output currents measured by the measurer and compare the received output currents with a set value. The apparatus also includes a failure determination processor configured to detect a switch having an output current equal to or smaller than the set value based on the comparison performed by the comparison processor to determine the switch as faulty. The failure determination processor is also configured to, upon detecting a faulty switch, identify which phase switch is faulty to change the duty ratio of the switch determined to be faulty and to perform phase shift on switches not determined to be faulty.

In an embodiment, the comparison processor may receive output currents of at least two phases coupled to a load and compare the same with the set value.

In another embodiment, the failure determination processor may determine whether any of the switches, located at the upper and lower ends of each of the three phases, has an output current equal to or smaller than the set value to determine the switch having the output current equal to or smaller than the set value as faulty. The failure determination processor may also control a duty ratio of a phase determined to be faulty and perform phase shift on phases operating in normal state.

In still another embodiment, when a phase A upper switch S1 is determined to be faulty, the failure determination processor may set a phase A duty ratio to 0, perform PhaseA/180 phase shift on phase B, and perform |(PhaseC/180−PhaseA/180)| phase shift on phase C.

In yet another embodiment, when a phase A lower switch S2 is determined to be faulty, the failure determination processor may set a phase A duty ratio to 1, perform 1−PhaseA/180 phase shift on phase B, and perform 1−|(PhaseC/180−PhaseA/180)| phase shift on phase C.

In still yet another embodiment, when a phase B upper switch S3 is determined to be faulty, the failure determination processor may set a phase B duty ratio to 0, perform PhaseA/180 phase shift on phase A, and perform (PhaseC/180) phase shift on phase C.

In a further embodiment, when a phase B lower switch S4 is determined to be faulty, the failure determination processor may set a phase B duty ratio to 1, perform 1−PhaseA/180 phase shift on phase A, and perform (1−PhaseC/180) phase shift on phase C.

In another further embodiment, when a phase C upper switch S5 is determined to be faulty, the failure determination processor may set a phase C duty ratio to 0, perform |PhaseA/180−PhaseC/180| phase shift on phase A, and perform (PhaseC/180) phase shift on phase B.

In still another further embodiment, when a phase C lower switch S6 is determined to be faulty, the failure determination processor may set a phase C duty ratio to 1, perform 1−|(PhaseA/180 PhaseC/180)| phase shift on phase A, and perform 1−(PhaseC/180) phase shift on phase B.

In yet another further embodiment, the comparison processor may compare output currents measured two or more times by the measurer with the set value.

In another aspect, the present disclosure provides a method of diagnosing failure of an inverter. The method includes measuring output currents two times by a measurer. The method also includes compare the output currents with a set value by a comparison processor. The method also includes determining, by a failure determination processor, a failure of any of switches located at the upper and lower ends of each of the three phases based on the measured currents. The method also includes, when any of the switches located at the upper and lower ends of each of the three phases is determined to be faulty, controlling, by the failure determination processor, the duty ratio of a phase determined to be faulty and performing phase shift on a switch of a phase in normal operation.

In an embodiment, performing phase shift on the switch of the phase in normal operation may include, when a phase A upper switch S1 is determined to be faulty, setting a phase A duty ratio to 0, performing PhaseA/180 phase shift on phase B, and performing |(PhaseC/180−PhaseA/180)| phase shift on phase C, by the failure determination processor.

In another embodiment, performing phase shift on the switch of the phase in normal operation may include, when a phase A lower switch S2 is determined to be faulty, setting a phase A duty ratio to 1, performing 1−PhaseA/180 phase shift on phase B, and performing 1−|(PhaseC/180-PhaseA/180)| phase shift on phase C, by the failure determination processor.

In still another embodiment, performing phase shift on the switch of the phase in normal operation may include, when a phase B upper switch S3 is determined to be faulty, setting a phase B duty ratio to 0, performing PhaseA/180 phase shift on phase A, and performing (PhaseC/180) phase shift on phase C, by the failure determination processor.

In yet another embodiment, performing phase shift on the switch of the phase in normal operation may include, when a phase B lower switch S4 is determined to be faulty, setting a phase B duty ratio to 1, performing 1−PhaseA/180 phase shift on phase A, and performing (1−PhaseC/180) phase shift on phase C, by the failure determination processor.

In still yet another embodiment, performing phase shift on the switch of the phase in normal operation may include, when a phase C upper switch S5 is determined to be faulty, setting a phase C duty ratio to 0, performing |PhaseA/180−PhaseC/180| phase shift on phase A, and performing (PhaseC/180) phase shift on phase B, by the failure determination processor.

In a further embodiment, performing phase shift on the switch of the phase in normal operation may include, when a phase C lower switch S6 is determined to be faulty, setting a phase C duty ratio to 1, performing 1−|(PhaseA/180 PhaseC/180)| phase shift on phase A, and performing 1−(PhaseC/180) phase shift on phase B, by the failure determination processor.

In another further embodiment, performing phase shift on the switch of the phase in normal operation may include, changing, by the failure determination processor, the duty ratio of the switch determined to be faulty and performing phase shift on switches not determined to be faulty so that an effective value current equal to a current in a normal state is applied to the phase determined as switch failure.

Other aspects and embodiments of the disclosure are discussed herein.

It is to be understood that the terms "vehicle" or "vehicular" or other similar terms as used herein are inclusive of motor vehicles in general. Such motor vehicles may encompass passenger automobiles including sport utility vehicles (SUV), buses, trucks, various commercial vehicles, watercraft including a variety of boats and ships, aircraft, and the like. Such vehicles may also include hybrid vehicles, electric vehicles, plug-in hybrid electric vehicles, hydrogen-powered vehicles, and other alternative fuel vehicles (e.g., fuels derived from resources other than petroleum). As referred to herein, a hybrid vehicle is a vehicle that has two or more sources of power, such as for example, a vehicle powered by both gasoline and electricity.

The above and other features of the disclosure are discussed below.

BRIEF DESCRIPTION OF THE DRAWINGS

The above and other features of the present disclosure are described in detail with reference to certain embodiments thereof illustrated in the accompanying drawings, which are given hereinbelow by way of illustration only and thus are not intended to limit the present disclosure, and wherein:

FIG. 3 shows output currents measured upon failure of each of switches at the upper and lower ends of each phase as an embodiment of the present disclosure;

Figure 1:
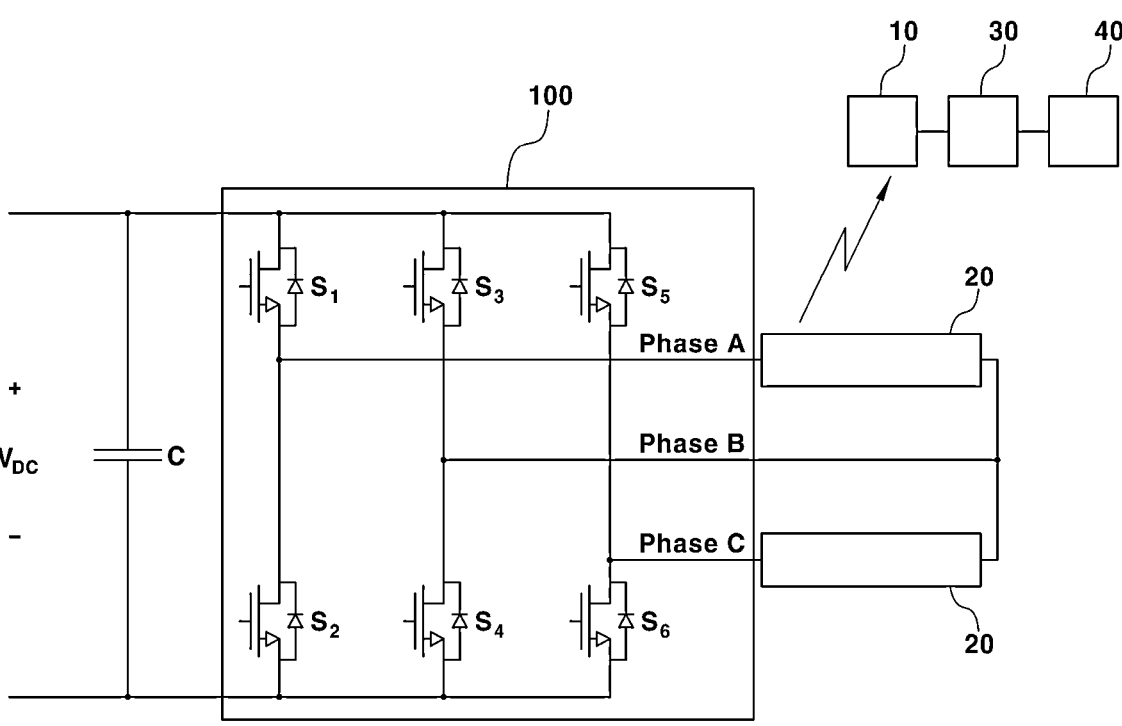
FIG. 1 shows a circuit diagram of an inverter fault detection apparatus as an embodiment of the present disclosure.

It should be understood that the appended drawings are not necessarily to scale. The appended drawings present a somewhat simplified representation of various features illustrating the basic principles of the present disclosure. The specific design features of the present technical concepts as disclosed herein, including, for example, specific dimensions, orientations, locations, and shapes, will be determined in part by the particular intended application and usage environment.

In the figures, the reference numbers refer to the same or equivalent parts of the present disclosure throughout the several figures of the drawing.

DETAILED DESCRIPTION

Hereinafter, embodiments of the present disclosure are described in detail with reference to the accompanying drawings. The embodiments of the present disclosure may be modified into various forms, and the scope of the present disclosure should not be construed as being limited to the following embodiments. The embodiments are provided to more completely explain the present disclosure to those having ordinary skill in the art.

In addition, terms such as " . . . phase," " . . . processor," etc. used in this specification each refer to a unit that processes at least one function or operation, and may be implemented as hardware, software or a combination thereof.

The terminology used herein is for the purpose of describing particular embodiments only and is not intended to be limiting. A singular representation may include a plural representation unless the singular presentation represents a definitely different meaning from the context.

Further, various embodiments herein may be implemented by software, e.g., a program, including commands stored in a storage medium readable by a machine, e.g., a computer (a machine-readable storage medium). The machine is a device capable of calling a stored command from a storage medium and operating in accordance with the called command and may include an electronic device (e.g., a server) according to the embodiments disclosed herein. The command may include code generated by a compiler or code that may be executed by an interpreter. The machine-readable storage medium may be provided in the form of a non-transitory storage medium. Here, "non-temporary" means that the storage medium does not contain a signal and is tangible but does not mean that data is stored semi-permanently or temporarily in the storage medium.

A processor may be implemented as a memory that stores algorithms for controlling operation of various components placed in a vehicle or data on a program that reproduces algorithms and a processor that performs the above-described operation using data stored in the memory. Here, the memory and the processor may be implemented as separate chips. Alternatively, the memory and the processor may be implemented as a single chip. For example, a controller as a processor may include an electronic control unit (ECU), a central processing unit (CPU), a microprocessor unit (MPU), a micro controller unit (MCU), an application processor (AP), or any type of processor well known in the art of the present disclosure. In addition, the controller may be a combination of software and hardware capable of performing calculations for at least one application or program to execute a method according to the embodiments of the present disclosure.

A comparison processor 30 and a failure determination processor 40 disclosed in the present disclosure may be implemented as one processor and may operate as a sub-processor of the controller located in a vehicle.

"Switch," "switch element," and "semiconductor switch" disclosed in this specification may all be interpreted as referring to the same component.

For the inverter switch disclosed in this specification, representative examples thereof include a metal oxide semiconductor field effect transistor (MOSFET), an insulated gate bipolar transistor (IGBT), and the like. The inverter switch may be of any type capable of performing a switching function.

A failure of an inverter disclosed in the present disclosure is used as a concept encompassing all failures, such as a failure of a semiconductor switch constituting the inverter and an open-circuit failure in an inoperable state.

Hereinafter, an embodiment is described in detail with reference to the accompanying drawings. In the description, given with reference to the accompanying drawings, the same or corresponding components are assigned the same reference numerals. A description thereof is not repeated.

Hereinafter, the present disclosure is described in more detail with reference to the accompanying drawings.

FIG. 1 is a view showing a general three-phase pulse width modulation (PWM) inverter system.

Referring to FIG. 1 showing a general three-phase PWM inverter system, Vdc denotes a DC power voltage, and ia, ib, and ic denote A, B, and C phase currents, respectively. Here, a load 20 is implemented as a heating glass panel or a color-changing glass panel. The heating glass panel or color-changing glass panel of the present disclosure may be configured to receive power from the three-phase PWM inverter system to apply power to a hot wire disposed on the glass panel or to change light transmittance of the glass panel.

The inverter fault detection apparatus according to the present disclosure is configured to receive a DC voltage from a DC power source and convert the same into an AC voltage for driving the glass panel as the load 20. The inverter fault detection apparatus is also configured to control the operation of the glass panel coupled to the three phases by the on/off operation of multi-semiconductor switch elements S1 to S6, which are internal switches. Here, as the inverter, a pulse width modulation (PWM) inverter is desirably used.

A measurer 10 is configured to measure the output currents of each of the three phases. In an embodiment, the measurer 10 may be implemented as an analog/digital (A/D) converter. Thus, when output voltage and output current signals (analog signals) output from the inverter and input to the three-phase load 20 are fed back to the measurer 10, the measurer 10 converts the same into digital signals. Further, the measurer 10 may measure output currents of two phases out of the three phases and send the output currents of the two phases to the comparison processor 30.

Moreover, the measurer 10 may be implemented as a digital signal processor (DSP). The measurer 10, as the DSP, receives and processes the output signals from the A/D converter, determines whether the inverter is faulty based on the result of the process, and, when the inverter is determined to be faulty, determines whether the multi-semiconductor switch elements S1 to S6 inside the inverter are in open-circuit failure.

The controller includes the comparison processor 30 configured to receive output currents of at least two phases measured by the measurer 10 and compare the same with a set value. The comparison processor 30 is configured to receive output current values of the three phases and compare the same with a set value stored in the comparison processor 30.

Moreover, the controller includes the failure determination processor 40 configured to receive the output currents of at least two phases out of the three phases measured by the comparison processor 30. The controller also determines a switch having an output current equal or smaller than the set value as faulty. The controller also identifies, upon detection of an inverter open-circuit failure, which phase switch is faulty. The controller also changes the duty ratio of the faulty switch and performs phase shift on switches not determined to be faulty. In an embodiment, the comparison processor 30 determines whether the absolute value of the received output current is smaller than or equal to the set value.

In other words, the controller compares the output currents of the three phases with the set value to determine which of the multi-semiconductor switch elements S1 to S6 of the inverter is in open-circuit failure. The controller also performs phase shift on the semiconductor switch elements in normal operation.

Therefore, even when one semiconductor switch element is faulty, the controller performs phase shift on the semiconductor switch elements in normal operation and controls the output duty ratio of the semiconductor switch element determined to be faulty. Thus, an output current equal to the effective value applied to the load 20 in a normal state is provided to the faulty switch.

As an embodiment of the present disclosure, the comparison processor 30 compares the output currents received from the measurer 10 with the set value to detect the location of any of the semiconductor switch elements S1 to S6 determined to be faulty. The failure determination processor 40 performs phase shift on the semiconductor switch elements in normal operation depending on the location of the semiconductor switch element determined to be faulty by the comparison processor 30. At the same time, the failure determination processor 40 controls the duty ratio of the semiconductor switch element of the phase determined to be faulty.

The comparison processor 30 compares the output current received from each phase with a set value, and the set value may be 0 depending on an embodiment. Further, the comparison processor 30 may be configured to receive output currents from the measurer 10 and compare the same with the set value two or more times. In other words, the comparison processor 30 judges the abnormality of the output currents two or more times and compares the same with the set value. Thus, the failure of the inverter may be more accurately determined.

Moreover, the comparison processor 30 receives current outputs on phase A and C from the measurer 10, compares the same with the set value, and thus determine whether any of the switches located at the upper and lower ends of each of the phases A, B, and C is faulty.

The failure determination processor 40 is configured to determine whether any of the phase A upper switch S1, the phase A lower switch S2, the phase B upper switch S3, the phase B lower switch S4, the phase C upper switch S5, or the phase C lower switch S6 is faulty using the comparison processor 30. The failure determination processor 40 is also configured to perform phase shift on the switches, which are not determined to be faulty. Further, the failure determination processor 40 is configured to compensate the output duty ratio of the switch determined to be faulty.

As an embodiment of the present disclosure, when the phase A upper switch S1 is determined to be faulty, the failure determination processor 40 sets a phase A duty ratio to 0, performs PhaseA/180 phase shift on phase B, and performs |(PhaseC/180–PhaseA/180)| phase shift on phase C.

Further, when the phase A lower switch S2 is determined to be faulty, the failure determination processor 40 sets a phase A duty ratio to 1, performs 1–PhaseA/180 phase shift on phase B, and performs 1–|(PhaseC/180–PhaseA/180)| phase shift on phase C.

Further, when the phase B upper switch S3 is determined to be faulty, the failure determination processor 40 sets a phase B duty ratio to 0, performs PhaseA/180 phase shift on phase A, and performs (PhaseC/180) phase shift on phase C.

Further, when the phase B lower switch S4 is determined to be faulty, the failure determination processor 40 sets a phase B duty ratio to 1, performs 1–PhaseA/180 phase shift on phase A, and performs (1–PhaseC/180) phase shift on phase C.

Further, when the phase C upper switch S5 is determined to be faulty, the failure determination processor 40 sets a phase C duty ratio to 0, performs |PhaseA/180–PhaseC/180| phase shift on phase A, and performs (PhaseC/180) phase shift on phase B.

Further, when the phase C lower switch S6 is determined to be faulty, the failure determination processor 40 sets a phase C duty ratio to 1, performs 1–|(PhaseA/180–PhaseC/180)| phase shift on phase A, and performs 1–(PhaseC/180) phase shift on phase B.

Here, A, B, and C denote phase angles of currents output on phases A, B, and C, respectively, in a normal state. In addition, the duty ratios of phases A, B and C in the normal state are set to 0.5.

Because the failure determination processor 40 determines a failure of the switches, disposed at the upper and lower ends of each phase, to perform phase shift on switches in normal operation in response to the switch determined to be faulty and, at the same time, to compensate the duty ratio of the switch determined to be faulty, redundancy may be ensured so that a power equal to the effective value of the current in a normal state is applied to the load 20.

Figure 2:
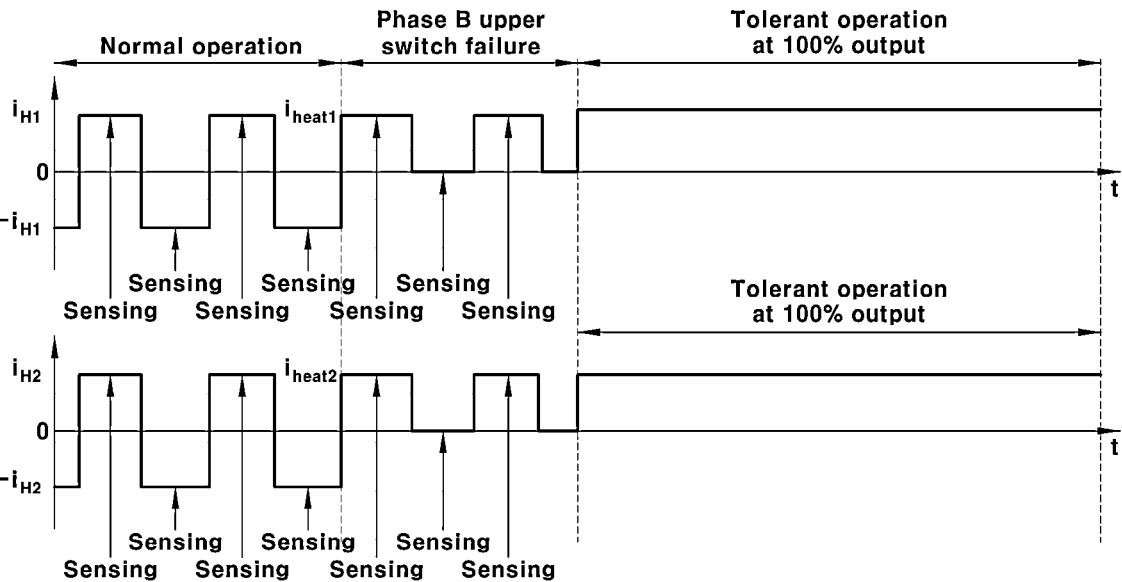
FIG. 2 shows output currents upon failure of a phase B upper switch as an embodiment of the present disclosure.

FIG. 2 shows output currents upon failure of the phase B upper switch S3 as an embodiment of the present disclosure.

In an embodiment of the present disclosure, the load is measured by applying heating glass or color-changing glass loads. Also, as shown in FIG. 2, output current of $i_{H1}$ to $-i_{H1}$ measured at phase A in a normal state and output current of $i_{H2}$ to $-i_{H2}$ measured at phase C in a normal state are received by the comparison processor 30 from the measurer 10.

When the phase B upper switch S3 is faulty, output current of $i_{H1}$ to 0 is measured at phase A in a normal state and output current of $i_{H2}$ to 0 is measured at phase C in a normal state.

In other words, when the phase B upper switch S3 fails, no negative current is detected to be applied to phases A and C. Accordingly, the phase B upper switch S3 is determined to be faulty.

Similarly, FIG. 3 shows output currents measured upon failure of the switches S1 and S2 disposed at the upper and lower ends of phase A, respectively, the switches S3 and S4 disposed at the upper and lower ends of phase B, respectively, and the switches S5 and S6 disposed at the upper and lower ends of phase C, respectively.

As shown in FIG. 3, when the semiconductor switch element, as the switch S1 located at phase A upper end, is determined to be faulty, the positive current of phase A is measured as 0 by the measurer 10. Conversely, when the semiconductor switch element S2 located at the lower end of phase A is determined to be faulty, the negative current of phase A is measured as 0.

Further, when the switch S3 at the upper end of phase C is determined to be faulty, the negative currents of phase A and phase C are measured as 0, and when the switch S4 at the lower end of phase B is determined to be faulty, the positive currents of phase A and phase C are measured as 0.

Moreover, when the switch S5 at the upper end of phase C is determined to be faulty, the positive current of phase C is measured as 0, and when the switch S6 at the lower end of phase C is determined to be faulty, the negative current of phase C is measured as 0.

In an embodiment of the present disclosure, currents applied to each of the phases are measured two times by the measurer 10 to determine failure of each of the switches, corresponding the number of times measured. In an embodiment, the comparison processor 30 is configured to set the set value to have a current value of 0 or greater in response to the faulty switch located at the corresponding phase. When any of the output currents of the phases received from the measurer 10 has a value equal or smaller than the set value, the switch located at the corresponding phase is determined to be faulty.

Figure 4:
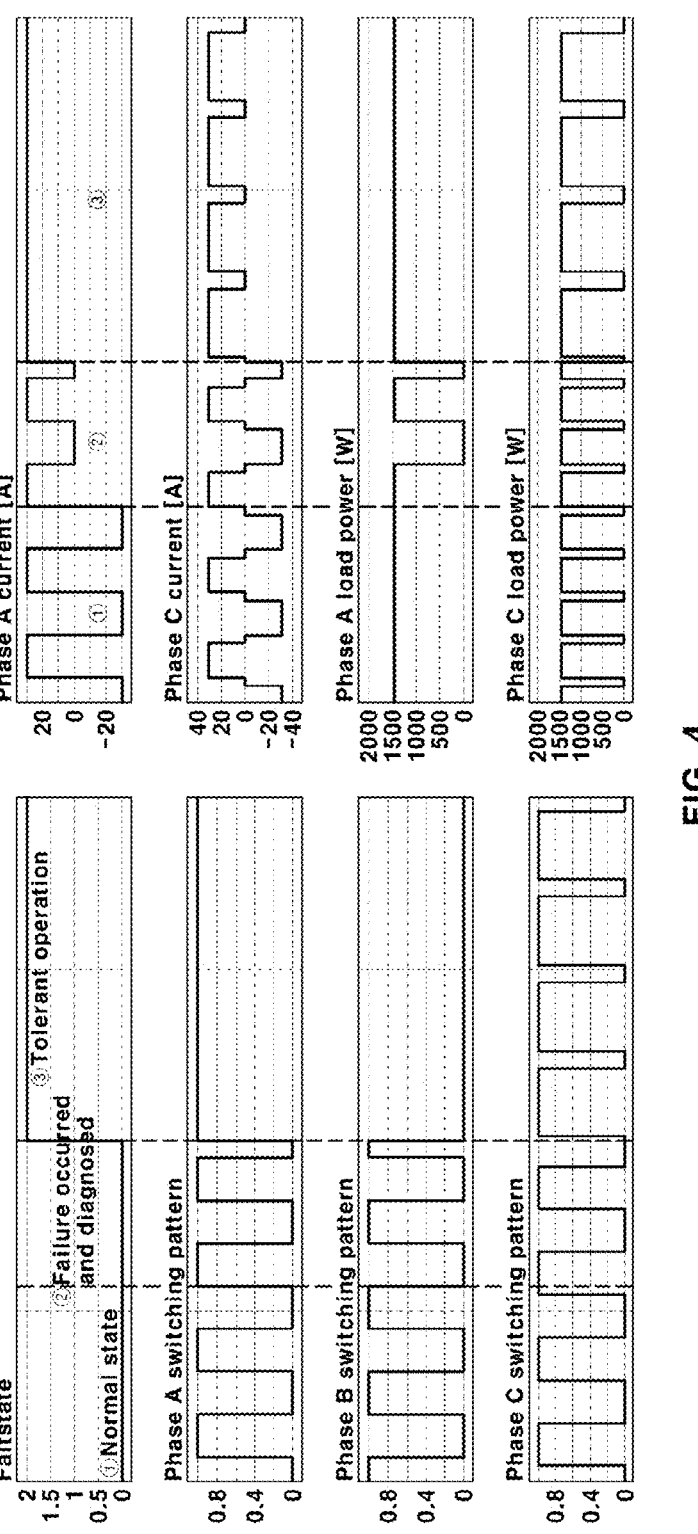
FIG. 4 is a graph showing tolerant operation upon failure of a phase A lower switch as an embodiment of the present disclosure.

FIG. 4 shows control steps performed when the phase A lower switch S2 fails, as an embodiment of the present disclosure.

As shown in FIG. 4, when switched from a normal state to a fault state, the comparison processor 30 receives phase A current, the output current of $i_{H1}$ to 0, twice from the measurer 10. Then, the comparison processor 30 compares the received output current with the set value and determines that the phase A output current does not include a negative current. Next, the failure determination processor 40 determines a failure of the phase A lower switch S2 based on the fact that a phase A negative output current is not applied and sets phase A duty ratio to 1. Thereafter, the failure determination processor 40 performs 1−PhaseA/180 phase shift on phase B and performs 1−|(PhaseC/180−PhaseA/180)| phase shift on phase C.

Therefore, the failure determination processor 40 maintains the output current as $i_{H1}$ in a tolerant operation after securing redundancy on phase A and controls the power of the load 20 on phase A to be equal to the power in a normal state.

Figure 5:
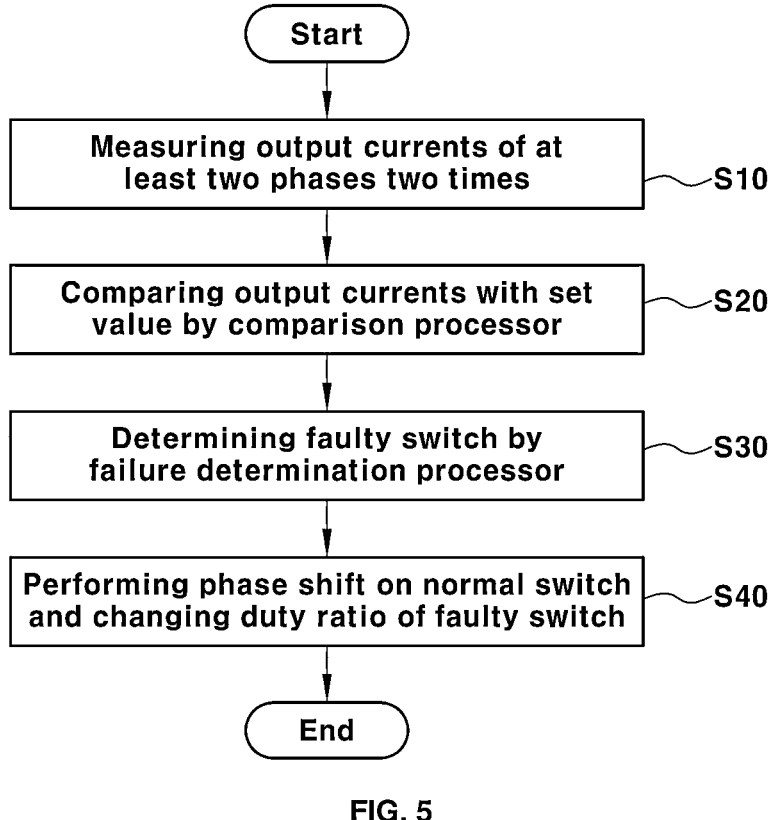
FIG. 5 is a flowchart showing a method of determining failure of an inverter as a different embodiment of the present disclosure.

FIG. 5 is a flowchart showing a method of determining failure of an inverter, as a different embodiment of the present disclosure.

In an embodiment of the present disclosure, a step of measuring currents applied to the three phases by the comparison processor 30 at least two times is performed (S10). In an embodiment, a step of comparing, by the comparison processor 30, the output currents of the three phases measured two times by the measurer 10 with a set value is performed (S20).

Thereafter, by the failure determination processor 40, a step of determining whether any of the switches located at the upper and lower ends of each of the three phases is faulty based on the current measured by comparing the output current with the set value is performed (S30). When any of the switches located at the upper and lower ends of each of the three phases fails, determining a failure based on the output currents of phase A and phase C, as shown in FIG. 3, is performed.

When at least one of the switches located at the upper and lower ends of each of the three phases is determined to be faulty by the failure determination processor 40, controlling, by the failure determination processor, the duty ratio of the phase determined to be faulty is performed (S40). Further, performing, by the failure determination processor 40, phase shift on phase switches in normal operation is performed.

Here, in the step of performing control in response to the failure of each switch by the failure determination processor 40, when the phase A upper switch S1 is determined to be faulty, the failure determination processor 40 sets the phase A duty ratio to 0, performs PhaseA/180 phase shift on phase B, and performs |(PhaseC/180−PhaseA/180)| phase shift on phase C.

Further, in the step of performing phase shift on the switch in normal operation, when the phase A lower switch S2 is determined to be faulty, the failure determination processor 40 sets the phase A duty ratio to 1, performs 1−PhaseA/180 phase shift on phase B, and performs 1−|(PhaseC/180−PhaseA/180)| phase shift on phase C.

Further, in the step of performing phase shift on the switch in normal operation, when the phase B upper switch S3 is determined to be faulty, the failure determination processor 40 sets the phase B duty ratio to 0, performs PhaseA/180 phase shift on phase A, and performs (PhaseC/180) phase shift on phase C.

Further, in the step of performing phase shift on the switch in normal operation, when the phase B lower switch S4 is determined to be faulty, the failure determination processor 40 sets the phase B duty ratio to 1, performs 1−PhaseA/180 phase shift on phase A, and performs (1−PhaseC/180) phase shift on phase C.

Further, in the step of performing phase shift on the switch in normal operation, when the phase C upper switch S5 is determined to be faulty, the failure determination processor 40 sets the phase C duty ratio to 0, performs |PhaseA/180−PhaseC/180| phase shift on phase A, and performs (PhaseC/180) phase shift on phase B.

Further, in the step of performing phase shift on the switch in normal operation, when the phase C lower switch S6 is determined to be faulty, the failure determination processor 40 sets the phase C duty ratio to 1, performs 1−|(PhaseA/180−PhaseC/180)| phase shift on phase A, and performs 1−(PhaseC/180) phase shift on phase B.

In other words, the failure determination processor 40 changes the duty ratio of the switch determined to be faulty and performs phase shift on switches in normal operation so as to apply a current equal to the effective value applied to the load 20 in a normal state.

As is apparent from the above description, the present disclosure may obtain the following effects by the configuration, combination, and operation relationship described above with the present embodiment.

The present disclosure has a fail-safe effect enabling normal operation even when any of the inverters located at the upper and lower ends of each of the three phases fails.

Furthermore, according to the present disclosure, phase shift is performed, without coordinate conversion, on an inverter switch at a phase in normal operation to perform normal state operation. Thus, redundancy is secured.

The detailed description is merely intended to illustrate the present disclosure. In addition, the above description shows and describes embodiments of the present disclosure, but the present disclosure can be used in various other combinations, modifications, and environments. In other words, changes, or modifications are possible within the scope of the idea of the disclosure disclosed herein, the scope of equivalents to the described disclosure, and/or the scope of skill or knowledge in the art. The embodiments describe the states for implementing the technical idea of the present disclosure, and various changes required for specific application fields and uses of the present disclosure are possible. Therefore, the detailed description of the present disclosure is not intended to limit the present disclosure to the disclosed embodiments. Also, the appended claims should be construed to include other embodiments.

What is claimed is:

1. An apparatus for diagnosing failure of an inverter, the apparatus comprising:
   switches coupled to three phases of A, B, and C, respectively;
   a measurer configured to measure each of output currents of the three phases;
   a comparison processor configured to receive the output currents measured by the measurer and compare the received output currents with a set value; and
   a failure determination processor configured to detect a switch having an output current equal to or smaller than the set value based on the comparison performed by the comparison processor to determine the switch as faulty, and upon detecting faulty switch, configured to identify which phase switch is faulty to change duty ratio of the switch determined to be faulty and to perform phase shift on switches not determined to be faulty, wherein the failure determination processor is further configured to set a faulted phase duty ratio to 0, when an upper switch of the faulted phase is determined to be faulty.

2. The apparatus according to claim 1, wherein the comparison processor is further configured to receive the output currents of at least two phases coupled to a load and compares the received output currents with the set value.

3. The apparatus according to claim 2, wherein the failure determination processor is configured to:

determine whether any of the switches, located at upper and lower ends of each of the three phases, has an output current equal to or smaller than the set value and determine the switch having the output current equal to or smaller than the set value as faulty; and control a duty ratio of a phase determined to be faulty and perform phase shift on phases operating in normal state.

4. The apparatus according to claim 3, wherein, when a phase A upper switch S1 is determined to be faulty, the failure determination processor sets a phase A duty ratio to 0, performs PhaseA/180 phase shift on phase B, and performs |(PhaseC/180−PhaseA/180)| phase shift on phase C.

5. The apparatus according to claim 3, wherein, when a phase A lower switch S2 is determined to be faulty, the failure determination processor sets a phase A duty ratio to 1, performs 1−PhaseA/180 phase shift on phase B, and performs 1−|(PhaseC/180−PhaseA/180)| phase shift on phase C.

6. The apparatus according to claim 3, wherein, when a phase B upper switch S3 is determined to be faulty, the failure determination processor sets a phase B duty ratio to 0, performs PhaseA/180 phase shift on phase A, and performs (PhaseC/180) phase shift on phase C.

7. The apparatus according to claim 3, wherein, when a phase B lower switch S4 is determined to be faulty, the failure determination processor sets a phase B duty ratio to 1, performs 1−PhaseA/180 phase shift on phase A, and performs (1−PhaseC/180) phase shift on phase C.

8. The apparatus according to claim 3, wherein, when a phase C upper switch S5 is determined to be faulty, the failure determination processor sets a phase C duty ratio to 0, performs |PhaseA/180−PhaseC/180| phase shift on phase A, and performs (PhaseC/180) phase shift on phase B.

9. The apparatus according to claim 3, wherein, when a phase C lower switch S6 is determined to be faulty, the failure determination processor sets a phase C duty ratio to 1, performs 1−|(PhaseA/180−PhaseC/180)| phase shift on phase A, and performs 1−(PhaseC/180) phase shift on phase B.

10. The apparatus according to claim 1, wherein the comparison processor is further configured to compare the output currents measured two or more times by the measurer with the set value.

11. A method of diagnosing failure of an inverter, the method comprising:

measuring, by a measurer, output currents two times;

comparing, by a comparison processor, the output currents with a set value;

determining, by a failure determination processor, a failure of any of switches located at upper and lower ends of each of three phases based on the measured currents;

when any of the switches located at the upper and lower ends of each of the three phases is determined to be faulty, controlling, by the failure determination processor, a duty ratio of a phase determined to be faulty and performing phase shift on a switch of a phase in normal operation; and setting, by the failure determination processor, a faulted phase duty ratio to 0, when an upper switch of the faulted phase is determined to be faulty.

12. The method according to claim 11, wherein performing the phase shift on the switch of the phase in normal operation comprises, when a phase A upper switch S1 is determined to be faulty, setting a phase A duty ratio to 0, performing PhaseA/180 phase shift on phase B, and performing |(PhaseC/180−PhaseA/180)| phase shift on phase C, by the failure determination processor.

13. The method according to claim 11, wherein performing the phase shift on the switch of the phase in normal operation comprises, when a phase A lower switch S2 is determined to be faulty, setting a phase A duty ratio to 1, performing 1−PhaseA/180 phase shift on phase B, and performing 1−|(PhaseC/180−PhaseA/180)|phase shift on phase C, by the failure determination processor.

14. The method according to claim 11, wherein performing the phase shift on the switch of the phase in normal operation comprises, when a phase B upper switch S3 is determined to be faulty, setting a phase B duty ratio to 0, performing PhaseA/180 phase shift on phase A, and performing (PhaseC/180) phase shift on phase C, by the failure determination processor.

15. The method according to claim 11, wherein performing the phase shift on the switch of the phase in normal operation comprises, when a phase B lower switch S4 is determined to be faulty, setting a phase B duty ratio to 1, performing 1−PhaseA/180 phase shift on phase A, and performing (1−PhaseC/180) phase shift on phase C, by the failure determination processor.

16. The method according to claim 11, wherein performing the phase shift on the switch of the phase in normal operation comprises, when a phase C upper switch S5 is determined to be faulty, setting a phase C duty ratio to 0, performing |PhaseA/180−PhaseC/180| phase shift on phase A, and performing (PhaseC/180) phase shift on phase B, by the failure determination processor.

17. The method according to claim 11, wherein performing the phase shift on the switch of the phase in normal operation comprises, when a phase C lower switch S6 is determined to be faulty, setting a phase C duty ratio to 1, performing 1−|(PhaseA/180−PhaseC/180)|phase shift on phase A, and performing 1−(PhaseC/180) phase shift on phase B, by the failure determination processor.

18. The method according to claim 11, wherein performing the phase shift on the switch of the phase in normal operation comprises, changing, by the failure determination processor, duty ratio of the switch determined to be faulty and performing phase shift on switches not determined to be faulty so that an effective value current equal to a current in a normal state is applied to the phase determined as switch failure.

* * * * *